(12) United States Patent
Morf et al.

(45) Date of Patent: *May 30, 2023

(10) Patent No.: US 11,664,658 B2

(54) ELECTROSTATIC PROTECTION DEVICE

(71) Applicant: International Business Machines Corporation, Armonk, NY (US)

(72) Inventors: Thomas Morf, Gross (CH); Pier Andrea Francese, Adliswil (CH)

(73) Assignee: International Business Machines Corporation, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 17/745,958

(22) Filed: May 17, 2022

(65) Prior Publication Data

US 2022/0302698 A1 Sep. 22, 2022

Related U.S. Application Data

(63) Continuation of application No. 17/208,090, filed on Mar. 22, 2021, now Pat. No. 11,418,026.

(51) Int. Cl.
*H02H 9/04* (2006.01)
*H01L 27/02* (2006.01)

(52) U.S. Cl.
CPC ......... *H02H 9/046* (2013.01); *H01L 27/0248* (2013.01)

(58) Field of Classification Search
CPC .................. H02H 9/046; H01L 27/0248

(Continued)

(56) References Cited

U.S. PATENT DOCUMENTS 5,929,715 A * 7/1999 Nakamiya ............... G04G 19/00
331/62
6,147,564 A * 11/2000 Nakamiya ................. G04F 5/06
331/62

(Continued)

FOREIGN PATENT DOCUMENTS

CN 108809297 A * 11/2018 ......... H03F 3/45179
CN 108809297 A 11/2018

(Continued)

OTHER PUBLICATIONS

List of IBM Patents or Patent Applications Treated as Related, Filed May 17, 2022, 2 pages.

(Continued)

*Primary Examiner* — Dharti H Patel
(74) *Attorney, Agent, or Firm* — Aaron Pontikos

(57) ABSTRACT

An electrostatic protection device for protecting an input port of an electronic circuit. The electrostatic protection device includes a first stacked coil, a second stacked coil, and an input terminal, wherein the second stacked coil is inductively coupled to the first stacked coil. The first stacked coil comprises a first coil input connected to the input terminal, and a first coil output port connected to a lower frequency ESD protection circuit, and wherein the lower frequency ESD protection circuit comprises a lower frequency output. The second stacked coil comprises an output port connected to a higher frequency ESD protection circuit, and wherein the higher frequency ESD protection circuit comprises a higher frequency output.

25 Claims, 9 Drawing Sheets

(58) Field of Classification Search
USPC .......................................................... 361/56
See application file for complete search history.

(56) References Cited

U.S. PATENT DOCUMENTS

| | | | |
|---|---|---|---|
| 8,453,092 | B2 | 5/2013 | Kireev |
| 9,397,087 | B1 | 7/2016 | Kull |
| 9,502,168 | B1* | 11/2016 | Ler .................. H01L 23/64 |
| 10,498,139 | B2 | 12/2019 | Fan |
| 10,637,234 | B2* | 4/2020 | Morf .................. H02H 9/046 |
| 10,681,802 | B1* | 6/2020 | Beukema ............ H05K 1/0248 |
| 10,742,026 | B2* | 8/2020 | Francese ............ H03H 7/0107 |
| 10,917,084 | B2* | 2/2021 | Lee .................. H03K 17/08 |
| 11,038,477 | B2* | 6/2021 | Raymond ............ H03F 3/213 |
| 2002/0121924 | A1 | 9/2002 | Yue |
| 2004/0032706 | A1* | 2/2004 | Kemmochi ............ H05K 1/181 |
| | | | 361/306.3 |
| 2007/0030096 | A1* | 2/2007 | Nishihara ............ H03H 9/605 |
| | | | 333/133 |
| 2008/0055803 | A1* | 3/2008 | Kienmayer ......... H01L 27/0251 |
| | | | 361/56 |
| 2008/0258840 | A1* | 10/2008 | Sato .................. H01P 1/20 |
| 2008/0303511 | A1* | 12/2008 | Grno .................. G01R 15/181 |
| | | | 324/117 R |
| 2010/0134944 | A1* | 6/2010 | Yamamoto .......... H03F 3/45991 |
| | | | 361/143 |
| 2010/0277839 | A1* | 11/2010 | Nicholson ................ G01R 1/36 |
| | | | 361/54 |
| 2011/0248811 | A1* | 10/2011 | Kireev ................ H01L 23/5227 |
| | | | 336/200 |
| 2012/0112979 | A1* | 5/2012 | Kato ...................... H01Q 21/28 |
| | | | 343/853 |
| 2012/0314328 | A1 | 12/2012 | Dill |
| 2013/0064326 | A1 | 3/2013 | Chen |
| 2014/0022030 | A1* | 1/2014 | Wu ......................... H03H 7/19 |
| | | | 333/170 |
| 2014/0307355 | A1* | 10/2014 | Tsai ......................... H03F 1/52 |
| | | | 361/56 |
| 2014/0347773 | A1* | 11/2014 | Park ...................... H02H 9/005 |
| | | | 333/181 |
| 2015/0162744 | A1* | 6/2015 | Liu ........................ H01L 24/48 |
| | | | 361/111 |
| 2015/0340359 | A1* | 11/2015 | Li ........................ H01L 27/0266 |
| | | | 361/56 |
| 2016/0142031 | A1* | 5/2016 | Ueki ...................... H02H 9/045 |
| | | | 333/175 |
| 2017/0069464 | A1* | 3/2017 | Ye .................... H01L 21/67103 |
| 2017/0373493 | A1* | 12/2017 | Morf .................... H02H 9/046 |
| 2018/0069396 | A1* | 3/2018 | Schuett .................. H02H 9/046 |
| 2019/0074129 | A1* | 3/2019 | Fan ........................ H01F 27/29 |
| 2019/0334517 | A1* | 10/2019 | Lee ...................... H03K 17/161 |
| 2020/0219828 | A1* | 7/2020 | Liu ........................ H01L 24/17 |

FOREIGN PATENT DOCUMENTS

| | | | | |
|---|---|---|---|---|
| GB | 2031639 A | * | 4/1980 | ............. G11B 5/027 |
| WO | WO-2011090048 A1 | * | 7/2011 | ............. H01F 19/04 |
| WO | WO-2018066578 A1 | * | 4/2018 | ........... H01L 21/822 |
| WO | 2022200872 A1 | | 9/2022 | |

OTHER PUBLICATIONS

Galal et al., "Broadband ESD Protection Circuits in CMOS Technology", IEEE Journal of Solid-State Circuits, vol. 38, No. 12, Dec. 2003, pp. 2334-2340, Digital Object Identifier 10.1109/JSSC.2003.818568.

Galal et al., "Broadband ESD Protection Circuits in CMOS Technology", ISSCC 2003 / Session 10 / High Speed Building Blocks / PAPER 10.5, Feb. 11, 2003, 10 pages.

International Search Report and Written Opinion, International Application No. PCT/IB2022/051103, International Filing Date Feb. 8, 2022.

Morf et al., Electrostatic Protection Device, U.S. Appl. No. 17/208,090, filed Mar. 22, 2021, IBM Docket No. P202004018US01.

Razavi, Behzad, "The Bridged T-Coil", A Circuit for All Seasons, IEEE Solid-State Circuits Magazine, Fall 2015, pp. 9-13.

Staric et al., "Wideband Amplifiers", Springer 1st print: 2006, reprints: 2017, 2015. ISBN 978-0-387-28341-8, Part 2, Inductive Peaking Circuits, 112 pages, <https://www.springer.com/gp/book/97803872834011>.

Wu et al., "Co-design of 40Gb/s Equalizers for Wireline Transceiver in 65nm CMOS Technology", IEEE International Conference on Electron Devices and Solid-State Circuits (EDSSC), pp. 1-2, 2014.

Keel et al., "CDM-Reliable T-coil Techniques for High-Speed Wireline Receivers", 2015 37th Electrical Overstress/Electrostatic Discharge Symposium (EOS/ESD), Reno, NV, USA, 2015, pp. 1-10, doi: 10.1109/EOSESD.2015.7314784.

Zhou et al., "A28-Gb/s transmitter with 3-tap FFE and T-coil enhanced terminal in 65-nm CMOS technology," 2016 14th IEEE International New Circuits and Systems Conference (NEWCAS), Vancouver, BC, Canada, 2016, pp. 1-4, doi: 10.1109/NEWCAS.2016.7604789.

* cited by examiner

ELECTROSTATIC PROTECTION DEVICE

BACKGROUND

The present invention relates to integrated circuits, in particular to the electrostatic protection of input ports for integrated circuits.

Integrated circuits (ICs) may incorporate dedicated circuitry to protect them against Electrostatic Discharge (ESD) events at their input/output (I/O) pads. The fulfillment of this ESD protection requirement may be challenging when broadband high-frequency signals are transmitted and/or received across the I/O pads of the IC.

ESD protection devices in integrated circuits often comprise devices such as inductors and coils. As the dimensions of integrated circuits shrink and clock rates increase, it is difficult or sometimes not even possible to scale the designs of ESD protection devices. Existing ESD protection device designs often do not provide the necessary bandwidth.

SUMMARY

In one aspect the invention relates to an electrostatic protection device for protecting an input port of an electronic circuit. The electronic protection device comprises a first stacked coil and a second stacked coil. The first stacked coil and the second stacked coil may be stacked upon each other. Formed in an integrated circuit, the first stacked coil and the second stacked coil may be formed physically one above the other.

The electrostatic protection device comprises an input terminal. The first stacked coil comprises a first coil input connected to the input terminal. The first stacked coil comprises a first coil output port connected to a lower frequency ESD protection circuit. The second stacked coil is inductively coupled to the first stacked coil. The second stacked coil comprises an output port connected to a higher frequency ESD protection circuit. The higher frequency ESD protection circuit comprises a higher frequency output. The lower frequency ESD protection circuit comprises a lower frequency output.

According to a further aspect of the present invention, the invention further provides for an integrated circuit incorporating the electrostatic protection device for protecting an input port of an electronic circuit.

BRIEF DESCRIPTION OF THE SEVERAL VIEWS OF THE DRAWINGS

In the following, embodiments of the invention are explained in greater detail, by way of example only, making reference to the drawings in which.

DETAILED DESCRIPTION

Figure 1:
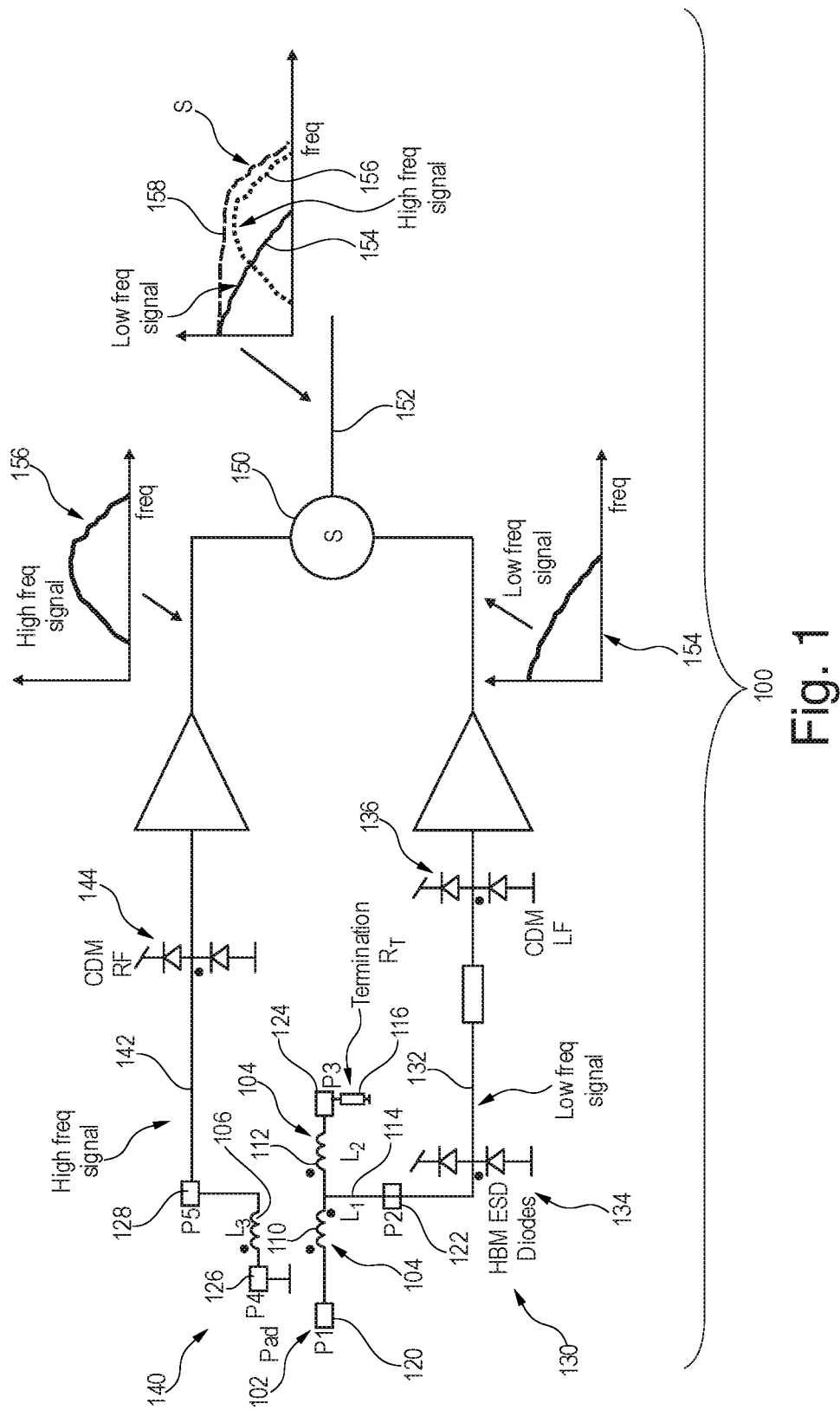
FIG. 1 illustrates an example of an electrostatic protection device.

The descriptions of the various embodiments of the present invention will be presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Embodiments of the present invention are beneficial because they provide for an effective means of increasing the bandwidth of an electrostatic protection device. The signal is broken into lower and higher frequency components which are then treated separately and then recombined. The terms lower frequency ESD protection circuit and higher frequency ESD protection circuit are names which are used to differentiate two separate ESD protection circuits. The term higher frequency output and lower frequency output are used to differentiate or name two different frequency outputs that are used in the circuit.

In some embodiments, both the human body model (HBM) Electro Static Discharge (ESD) protection circuit and the charge device model (CDM) ESD protection circuit may refer to ESD protection circuits that incorporate clamping circuits, such as diodes, connected to both of the power supply rails (supply and ground). The HBM and CDM ESD devices may also, in practice, incorporate a capacitance to ground that is caused by the diode junction capacitance and the parasitic wiring capacitance of the diodes, for the CDM diode, the diode junction, parasitic and the RX input capacitance. The charge device ESD protection may further incorporate a resistor and/or impedance in series with an input that limits current and separated HBM and CDM protection circuits.

In another embodiment, the first stacked coil and the second stacked coil form a crossover network configured to divide a signal input into the input terminal into a higher frequency component and a lower frequency component. The use of the inductive circuit provides a means for naturally dividing the input signal into these two components. The higher frequency component is output by the higher frequency output and the lower frequency output is output by the lower frequency output.

One potential advantage of this embodiment is that the higher and lower frequency components of an ESD event can have different amounts of current. For example, the lower frequency component of the ESD event typically has a higher current than the higher frequency component of the ESD event. This effect may be used in designing an effective electrostatic protection device. The first stacked coil and the second stacked coil may effectively form a crossover network that decouples the higher frequency ESD protection circuit from the lower frequency component of the ESD event. This may enable the higher frequency ESD protection circuit and the lower frequency ESD protection circuit to have their components tailored for each particular type of ESD event. For example, the higher frequency ESD protection circuit may be designed with a lower current rating than the lower frequency ESD protection circuit.

In another embodiment, the first stacked coil is a t-coil with a single coil tap. In this embodiment, a t-coil structure is used for the lower frequency component. This may be beneficial because it is relatively simple to build the t-coil with a single tap and lower frequency ESD protection circuit so that it is able to deal with higher currents. However, this may affect the ability of it to respond to higher frequencies. It is therefore beneficial to couple the t-coil with the higher frequency ESD protection circuit to increase the bandwidth.

In another embodiment, the single coil tap divides the first stacked coil into a first coil portion and a second coil portion. The single coil tap is the first coil output. The second coil portion is connected between the single coil tap and the coil termination port. The first coil portion is connected between the single coil tap and the first coil input.

In another embodiment, the inductive coupling between the first coil portion and the second stacked coil is greater than the inductive coupling between the second coil portion and the second stacked coil. This embodiment may be beneficial during the construction of the electrostatic protection device because the signal picked up on the first coil portion may be more accurate. For example, if a signal goes through the first coil portion and then the second coil portion, the inductance of the first coil portion may cause a degradation in the high frequency component of the signal. Another advantage is that the current in the first coil portion may be higher. It may therefore increase the ability of the inductive coupling to take place.

In another embodiment, the second stacked coil comprises a reference port connected to a ground plane of the electrostatic protection device. This embodiment may be beneficial because it may provide for an effective means of referencing both the high and low frequency components.

In another embodiment, the lower frequency ESD protection circuit comprises a human body model ESD protection circuit. This may be beneficial because the human body model ESD protection circuit can be built specifically to handle the higher current and lower frequency component of an ESD event.

In another embodiment, the lower frequency ESD protection circuit comprises an additional charge device model ESD protection circuit. The various frequency components may be divided into upper, higher and lower portions but there may still be some portion of the higher frequency component of the ESD pulse that goes through the first stacked coil. Incorporating the additional charge device model ESD protection circuit may therefore be beneficial and increase the effectiveness of the ESD protection.

In another embodiment, the first stacked coil comprises a first coil tap and a second coil tap. The lower frequency ESD protection circuit is connected to the first coil tap and the second coil tap. This embodiment is similar to a t-coil arrangement, but instead of the first stacked coil being divided into two parts, it is divided into three parts. This may allow for a more sophisticated lower frequency ESD protection circuit.

In another embodiment, the first stacked coil comprises a first coil portion, an intermediate coil portion, and a second coil portion. The first coil portion is connected between the first coil input and the first coil tap. The intermediate coil portion is connected between the first coil tap and the second coil tap. The second coil portion is connected between the second coil tap and the first coil termination port.

In another embodiment, the lower frequency ESD protection circuit comprises a human body model ESD protection circuit. The lower frequency ESD protection comprises an additional charge device model ESD protection circuit. The additional charge device model ESD protection circuit is connected to the first coil tap and the human body model ESD protection circuit is connected to the second coil tap. This embodiment may be beneficial because it provides for a very effective ESD protection for lower frequencies.

In another embodiment, the second stacked coil comprises a reference port connected to a ground plane of the electrostatic protection device.

In another embodiment, the second stacked coil comprises a reference port connected to the second coil tap.

In another embodiment, the first stacked coil is at least partially formed from the top two metallization layers of the electrostatic protection device. This may be beneficial because the currents going through the first stacked coil may be larger than through the second stacked coil. The top two metallization layers of the electrostatic protection device may be thicker and provide for a first stacked coil that is less likely to be destroyed by an ESD event and have a lower resistance.

In another embodiment, the higher frequency ESD protection circuit comprises a primary charge device model ESD protection circuit. The use of the terms primary charge device model ESD protection circuit and additional charge device model ESD protection circuit are intended to indicate that there are two separate charge device model ESD protection circuits.

In another embodiment, the primary charge device model ESD protection circuit has a primarily reactive impedance. Because the signal from the ESD event has been divided effectively into two with the higher frequency component having a lower current, the primary charge device model ESD protection circuit can be specialized and designed in a way so that there is less power loss. In a conventional electrostatic protection device, the primary charge device model ESD protection circuit uses diodes that for smaller signals are effectively lossy capacitors. However, for larger voltages, the diodes begin to conduct and effectively provide a resistance which dissipates the ESD energy to ground. A reactive impedance may be used for the ESD protection circuit instead, as the data signal for higher frequency and low frequency ESD protection circuit are lower current.

In another embodiment, the summation circuit may be a continuous time linear equalizer circuit. For example, this may be a particularly effective way of combining the low and high frequency signal components.

In another embodiment, the input port of the electronic circuit is a differential input port. The differential input port is formed by two electrostatic protection devices connected together via the continuous time linear equalization circuit. The continuous time linear equalization circuit is used to combine the signals from two separate electrostatic protection devices. This may be beneficial because it may provide for better rejection of noise.

In another embodiment, the termination load is resistive. This, for example, may provide for an effective means of constructing the circuit.

In another aspect, the invention provides for an integrated circuit that comprises an electronic circuit. The integrated circuit comprises an electrostatic protection device for protecting the input port of the electronic circuit. The electrostatic protection device comprises a first stacked coil and a second stacked coil. The electrostatic protection device comprises an input terminal. The first stacked coil comprises a first coil input connected to the input terminal. The first stacked coil comprises a first coil output port connected to a lower frequency ESD protection circuit. The first stacked coil comprises a first coil termination port connected to a termination load. The second stacked coil is inductively coupled to the first stacked coil. The second stacked coil comprises an output port connected to a higher frequency ESD protection circuit. The higher frequency ESD protection circuit has a higher frequency output. The lower frequency ESD protection circuit has a lower frequency output. The electrostatic protection device comprises a summation circuit configured for outputting a summation of the higher frequency output and the lower frequency output to the input port of the electronic circuit.

In another embodiment, the integrated circuit may be any of the following: a microprocessor, a microcontroller, a graphical processing unit, a central processing unit, a wideband amplifier, an analogue-to-digital converter, a digital-to-analogue converter, a wireline transceiver circuit, and a telecommunications chip.

In another embodiment, the integrated circuit comprises a substrate. The electronic circuit is formed on the substrate. The electrostatic protection device is also formed on the substrate. The second stacked coil is formed closer to the substrate than the first stacked coil. This, for example, may be beneficial because thicker metal layers such as the final few metallization layers can be used for forming the first stacked coil. This may provide for a higher current rating and a lower resistance for the lower frequency EDS protection circuit.

FIG. 1 illustrates an example of an electrostatic protection device 100. The electrostatic protection device 100 has an input port 102. The input port 102 may be the input port for an electronic circuit that it is protecting. The electrostatic protection device 100 comprises a first stacked coil 104 and a second stacked coil 106. In this example, the first stacked coil 104 is divided into a first coil portion 110 and a second coil portion 112. There is a single coil tap 114 between the first coil portion 110 and the second coil portion 112. The first stacked coil 104 and the second stacked coil 106 are physically stacked upon each other such that the first stacked coil 104 and the second stacked coil 106 have an inductive coupling. In this particular figure, it is shown that the second stacked coil 106 is coupling predominantly to the first coil portion 110. This is however just one option. It could also couple primarily to the second coil portion 112.

The first stacked coil and the second stacked coil 104, 106 form a five-port device. The first port 120 is a first coil input. The second port 122 is a first coil output port and is the same as the single coil tap 114. The third port 124 is connected to the output of the second coil portion 112 and is connected to a termination load 116. The fourth port is a reference port 126 that is connected to one end of the second stacked coil 106 and the fifth port is a second coil output port 128 that is the other port of the second stacked coil 106.

The inductive coupling between the second stacked coil 106 and the first stacked coil 104 is configured such that it preferentially couples the high frequency component of a signal to a higher frequency ESD protection circuit 140. The uncoupled portion of the signal remains in the lower frequency ESD protection circuit 130. This therefore forms a higher frequency circuit path 142 and a lower frequency circuit path 132. The lower frequency circuit path 132 has a human body model ESD protection circuit 134 and an additional charge device model ESD protection circuit 136. The higher frequency circuit path 142 has a primary charge device model ESD protection circuit 144.

Both the higher frequency ESD protection circuit 140 and the lower frequency ESD protection circuit 130 are coupled to a summation circuit 150 through an amplifier. The summation circuit 150 sums a lower frequency output 154 and a higher frequency output 156 to an electrostatic protection device output 152 which has a summation 158 of both the lower frequency output 154 and the higher frequency output 156. This is illustrated by the graphs of the lower frequency signal and the higher frequency signal as shown in the plot.

Figure 2:
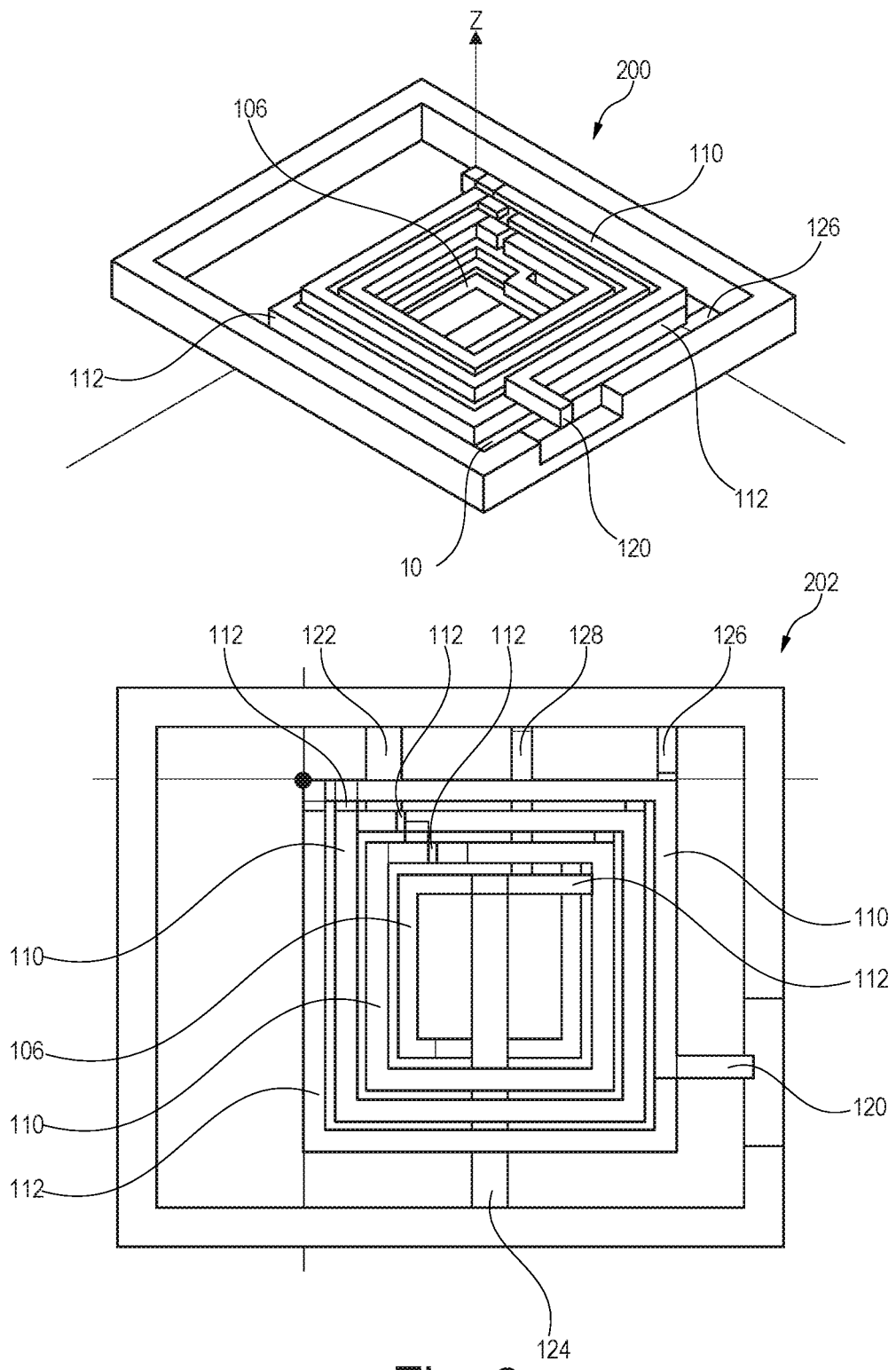
FIG. 2 illustrates an example of a first stacked coil and a second stacked coil.

FIG. 2 shows an example of the first stacked coil 104 and the second stacked coil 106. This figure shows a perspective view 200 and a top view 202. The figures show the first coil portion 110 and second coil portion 112 of the first stacked coil 104 on top of the second stacked coil 106. In this example, the second coil portion 112 is adjacent to the second stacked coil 106. The inductive coupling is likely stronger between the second stacked coil 106 and the second coil portion 112 than between the second stacked coil 106 and the first coil portion 110. This is the opposite of the situation that is illustrated in FIG. 1 where the drawing shows that the inductive coupling is primarily between the first coil portion 110 and the second stacked coil 106. The design in FIG. 2 could be readily modified to match what is illustrated in FIG. 1 by mechanically switching the position of the two coil portions 112 and 110. The coils illustrated in FIG. 2 could for example readily be manufactured using standard semiconductor manufacturing techniques.

Figure 3:
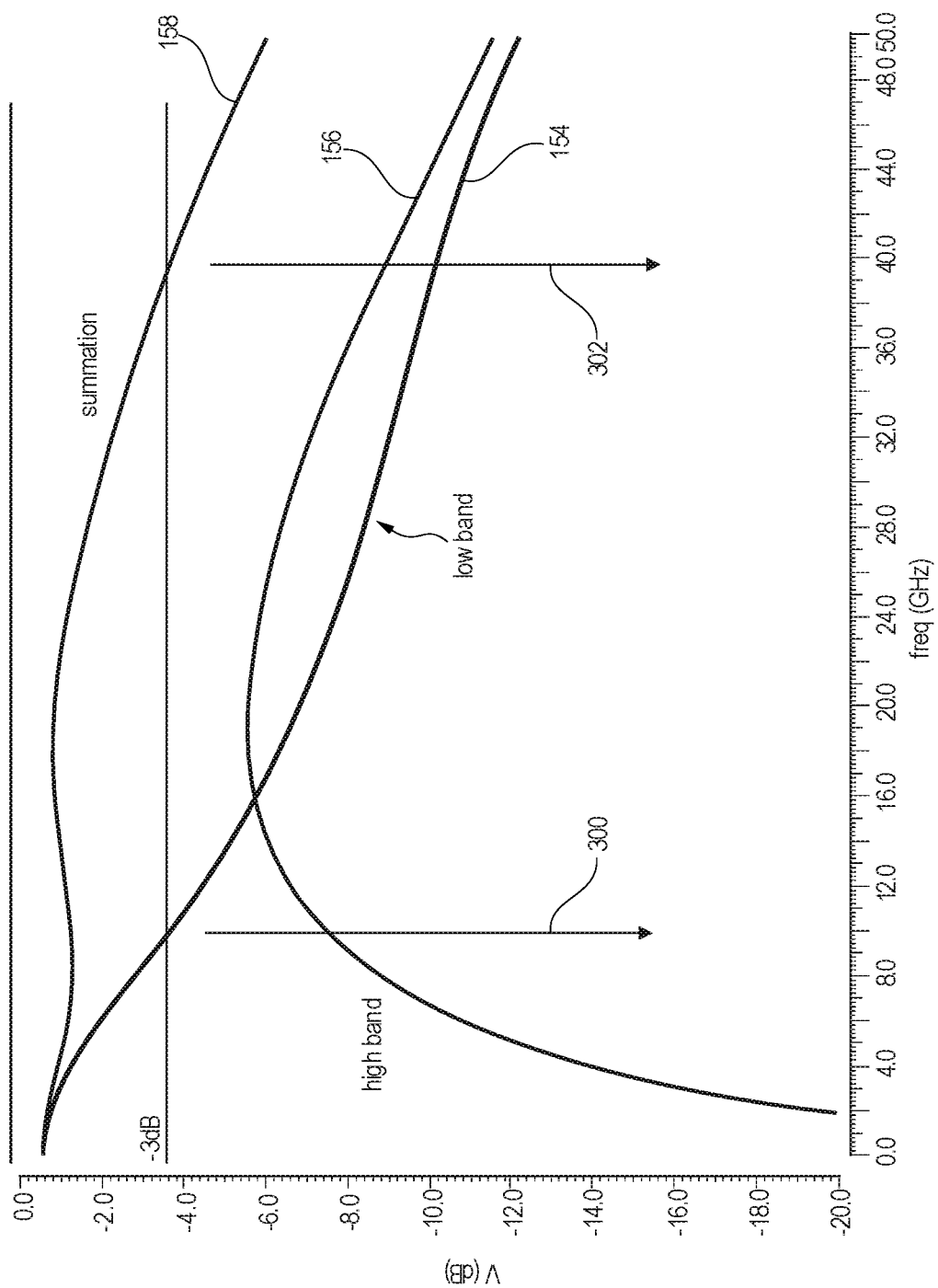
FIG. 3 shows a plot of the frequency transmission from a circuit simulation of the electrostatic device shown in FIG. 1.

FIG. 3 shows the frequency transmission from a simulation of the circuit illustrated in FIG. 1. The lower frequency output 154 and the higher frequency output 156 are plotted. The low band −3 dB point 300 is shown. The summation of both signals is illustrated by summation 158. The −3 dB point for the summation 158 is illustrated by the line 302. In comparison with the low band −3 dB point 300 the −3 dB point for the summation of the signals is greatly increased.

Figure 4:
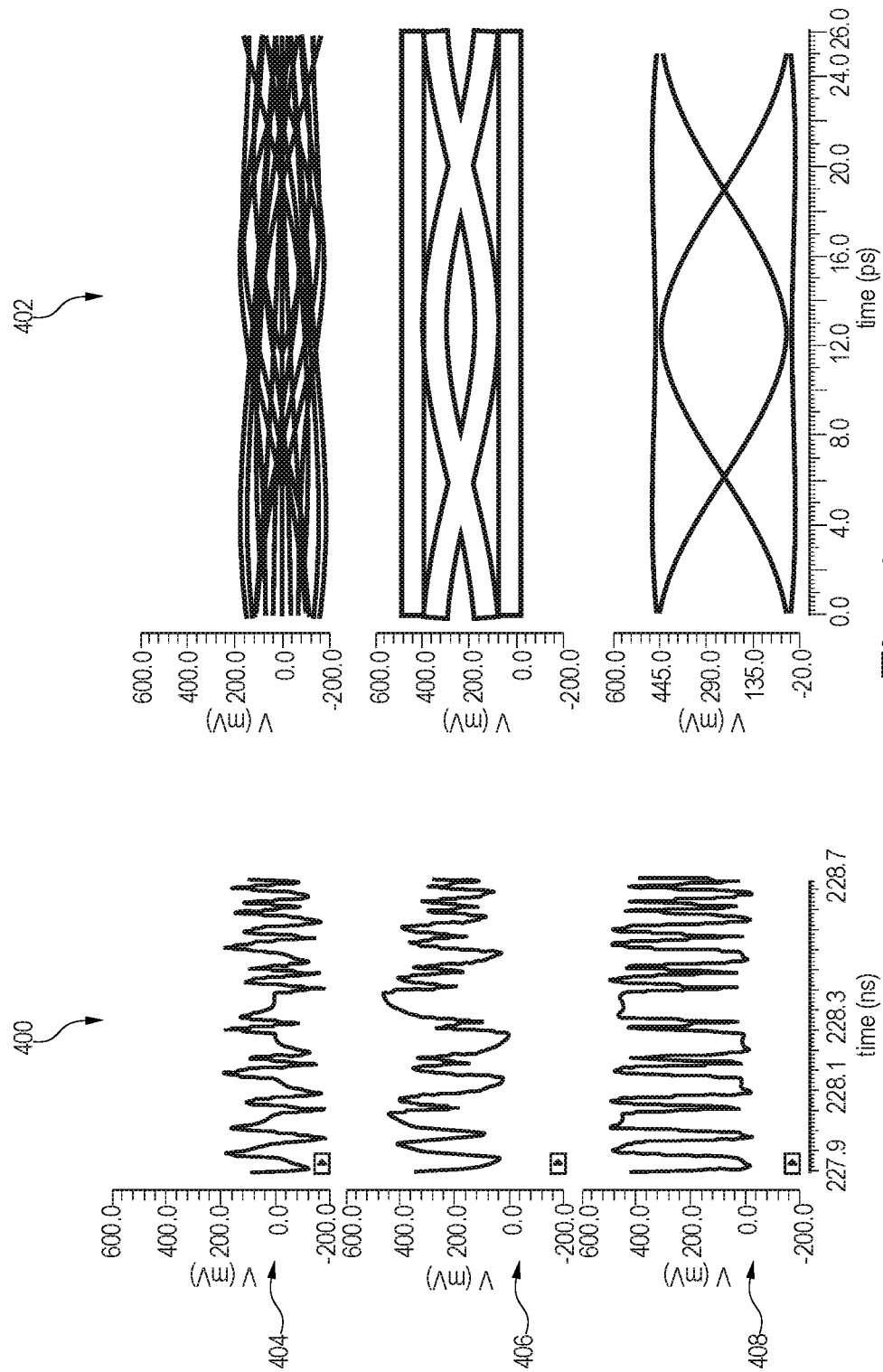
FIG. 4 illustrates the bandwidth provided by the electrostatic protection device of FIG. 1 as observed in an eye diagram.

FIG. 4 illustrates the bandwidth provided by the electrostatic device of FIG. 1. There are two groups of figures. The figures in column 400 represent the actual signals. The figures in column 402 are eye diagrams. Row 1 404 contains the higher frequency band. Row 2 is the lower frequency band 406. The lowest row 408 contains the summation of the higher frequency band 404 and the lower frequency band 406. The column 402 for the summation shows a relatively large bandwidth.

Figure 5:
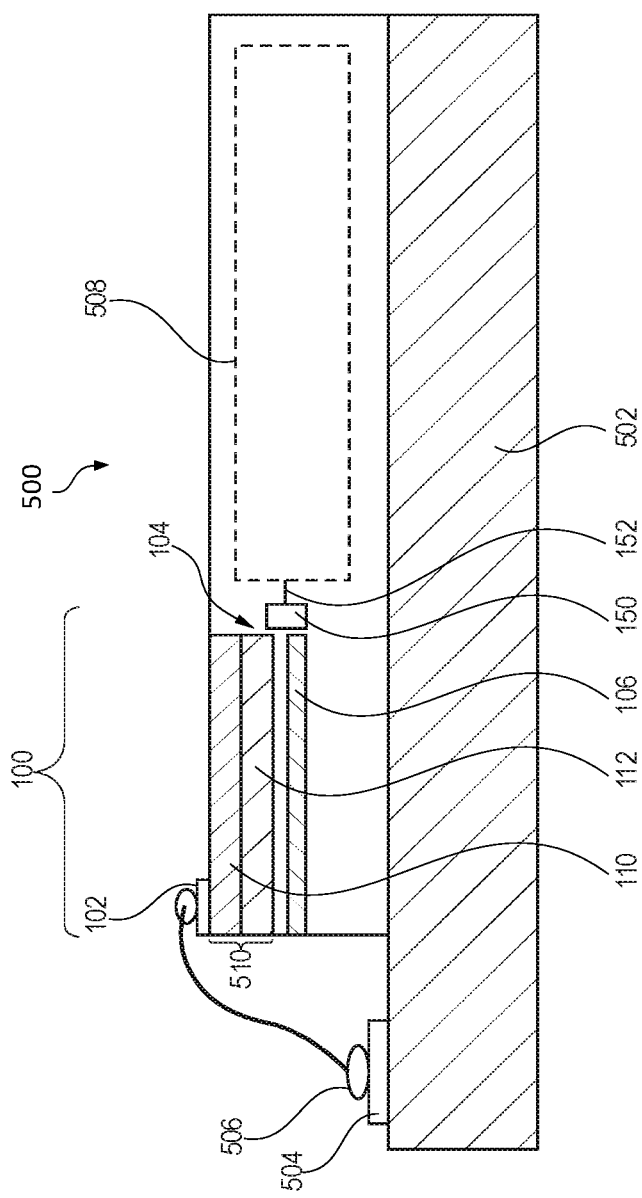
FIG. 5 illustrates an example of an integrated circuit.

FIG. 5 illustrates an example of an integrated circuit 500. The integrated circuit 500 comprises a substrate 502. There is an input pad 504 on the substrate 502. This is then wire bonded 506 to the input port 102. The first stacked coil 104 and second stacked coil 106, as is illustrated in FIG. 2, form part of the integrated circuit 500. The integrated circuit 500 comprises the electrostatic protection device 100 and forms the input for an electronic circuit 508. The first coil portion 110 and the second coil portion 112 are formed from the top two metallization layers 510. This enables these two portions 110, 112 to have a higher current rating and better withstand an ESD event.

Figure 6:
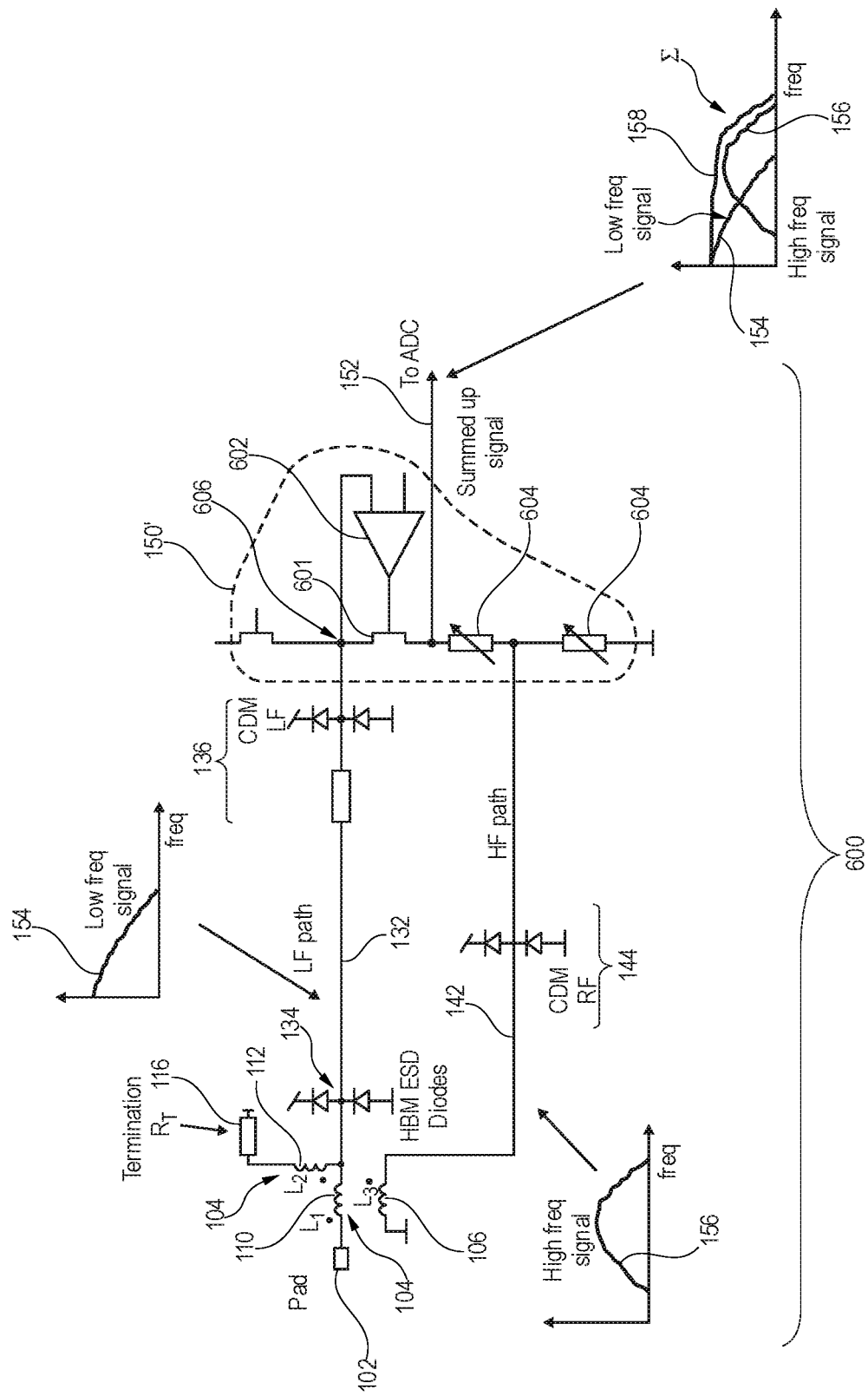
FIG. 6 illustrates a further example of an electrostatic protection device.

FIG. 6 illustrates a further example of an electrostatic protection circuit 600. The electrostatic protection circuit 600 in FIG. 6 is similar to that as was illustrated in FIG. 1. In this example, the summation circuit is a continuous time linear equalizer circuit 150'. The continuous time linear equalizer circuit 150' comprises an amplifier 602, a FET transistor 601, and several resistors 604. The resistances of resistors 604 can be adjusted so that the attenuation of the HF path 142 matches the amplitude of LF path 132. In the LF path 132, due to the feedback loop built of the amplifier 602 and the FET transistor 601, a virtual ground is formed 606. This forms a transimpedance amplifier (current to voltage amplifier). The LF 154 and the HF 156 signals are added at the bottom of the FET transistor 601 and the output 152 connects to a next stage, such as an analog to digital converter (ADC).

Figure 7:
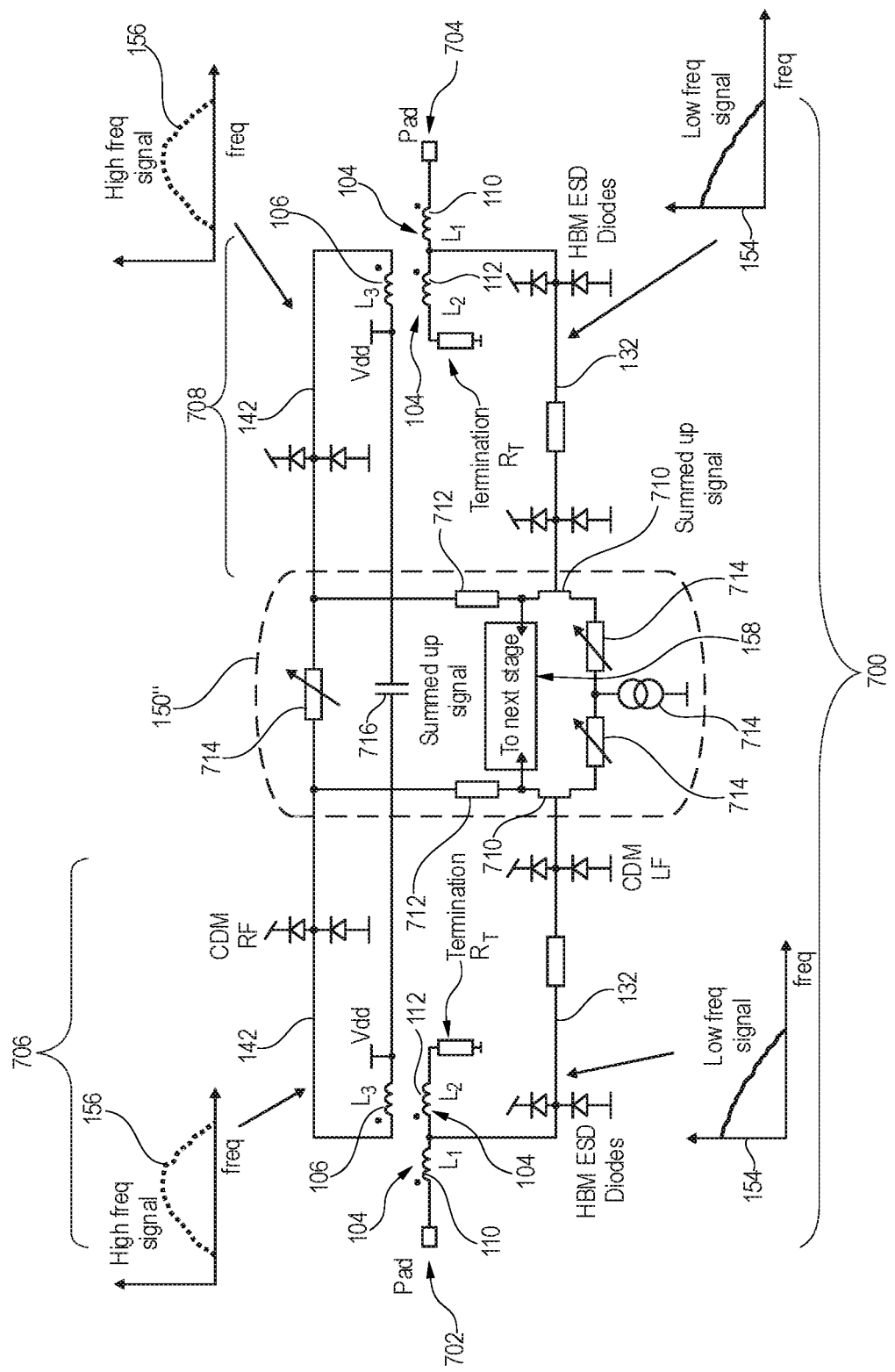
FIG. 7 illustrates a further example of an electrostatic protection device.

FIG. 7 illustrates a further example of a differential electrostatic protection device 700. There is a first differential input 702 and a second differential input 704. The first differential input 702 is connected to a first electrostatic protection device 706 which is similar to the electrostatic protection device 100 illustrated in FIG. 1. The second differential input 704 is connected as the input for a second electrostatic protection device 708. Likewise, the second electrostatic protection device 708 is similar to the electrostatic protection device 100 illustrated in FIG. 1.

The first electrostatic protection device 706 and the second electrostatic protection device 708 have some modifications with respect to the electrostatic protection device 100 of FIG. 1. Firstly, the second stacked coil 106 is shown as primarily coupling to the second coil portion 112 in both cases. The first electrostatic protection device 706 and the second electrostatic protection device 708 are shown as being connected and providing a differential summation using a continuous time linear actuator circuit 150".

The continuous time linear actuator circuit 150" is a differential amplifier in this example, with two FETs 710 with a resistor 712 at their drains. VDD (DC voltage) is supplied trough the inductors L3. The high frequency output 156 reaches the output (to next stage) via the drain resistors 712 where it is combined with the low frequency output 154 slightly amplified by the FETs 710. A current source is typical for differential amplifiers. The adjustable resistors 714, are configured to tune the circuit in order for the signal amplitude of the high and low frequency channel to match. Capacitor 716 between the two VDDs is just to block the power supply.

Figure 8:
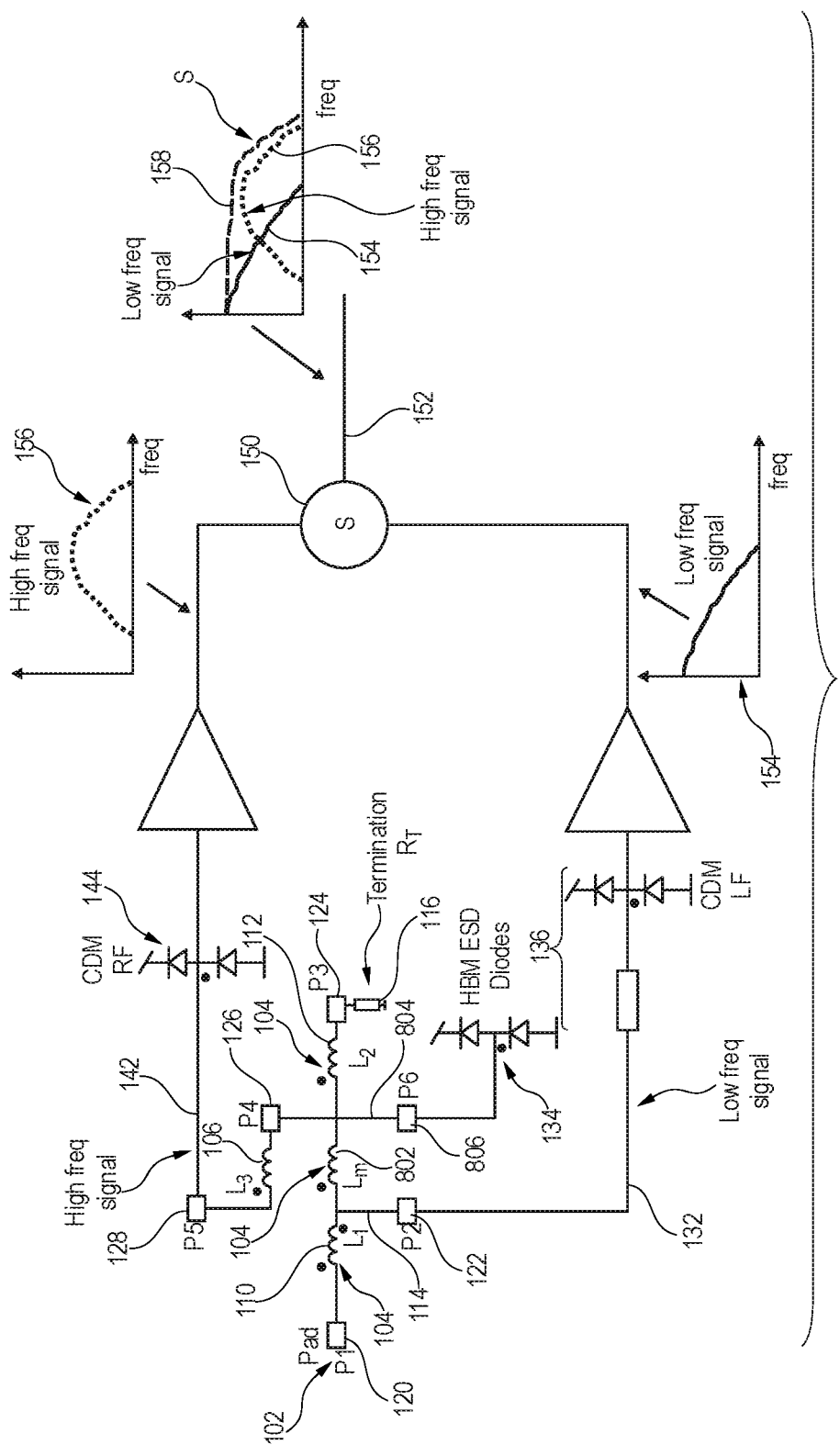
FIG. 8 illustrates a further example of an electrostatic protection device.

FIG. 8 illustrates a further example of an electrostatic protection device 800. In this example the first stacked coil 104 has been modified with respect to the example illustrated in FIG. 1. The first stacked coil 104 has been divided into three parts, a first coil portion 110, an intermediate coil portion 802 and a second coil portion 112. There is a first coil output port 122 between the first coil portion 110 and the intermediate coil portion 802. There is a sixth port 806 which is provided by a second coil tap 804. The second coil tap 804 is between the intermediate coil portion 802 and the second coil portion 112. The first stacked coil 104 and the second stacked coil 106 therefore form a sixth port device in this example. The example in FIG. 8 is further modified from that which is shown in FIG. 1 in that the additional charge device model ESD protection circuit 136 is shown as being connected to the second port or the first coil output port 122. The human body model ESD protection circuit 134 is shown as being connected to what is the sixth port or the second coil output port 806. In the circuit diagram the second stacked coil 106 is shown as coupling predominantly to the intermediate coil portion 802. However, this could be modified and the second stacked coil 106 could also predominantly couple to the first coil portion 110 or the second coil portion 112.

Figure 9:
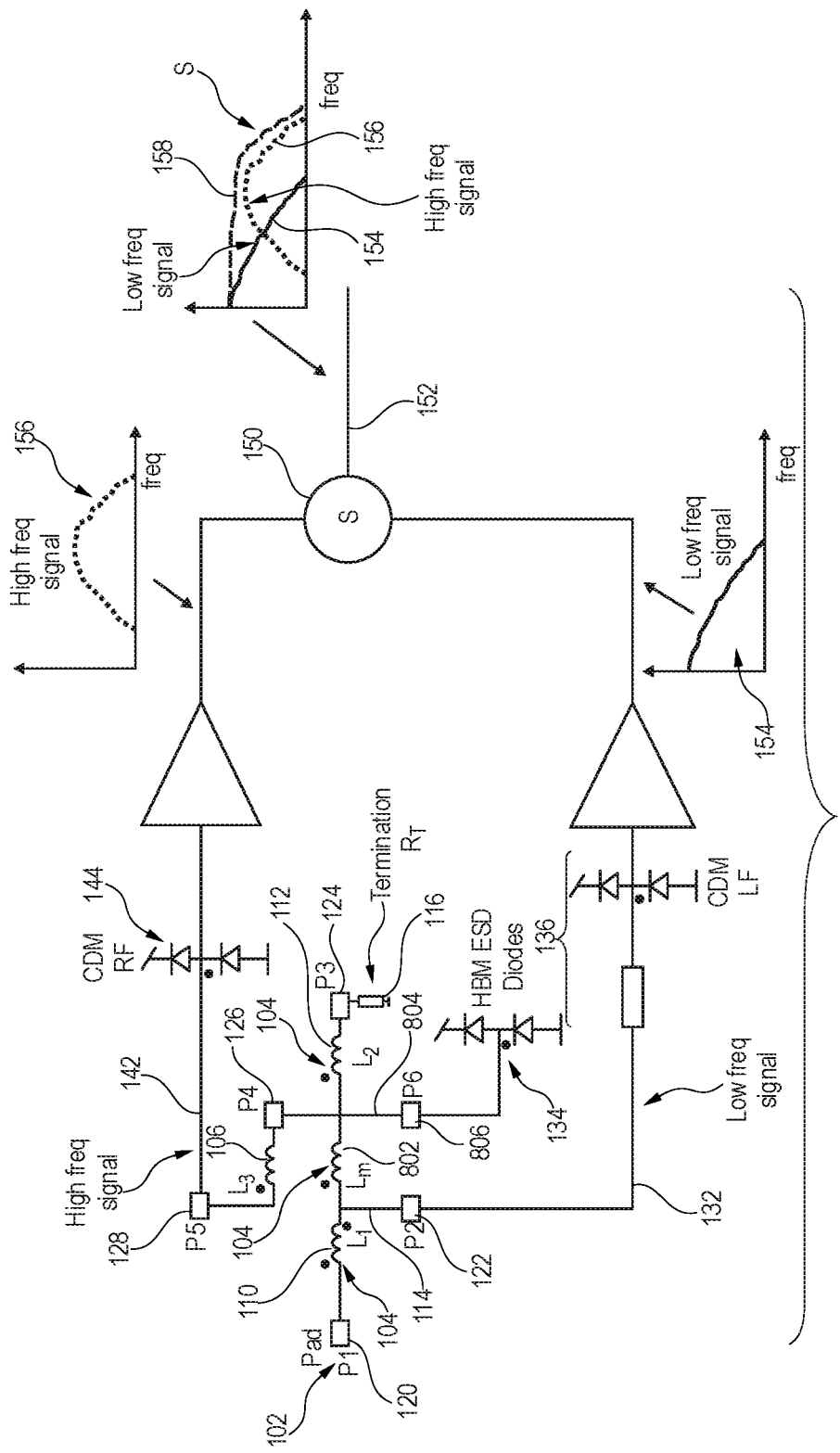
FIG. 9 illustrates a further example of an electrostatic protection device.

FIG. 9 shows a further example of an electrostatic protection device 900. The example illustrated in FIG. 9 is very similar to the example illustrated in FIG. 8 with a modification. In FIG. 8 the fourth port or the reference port 126 of the second stacked coil 106 was connected to a ground. In the example in FIG. 9 the fourth port or reference port 126 is instead connected to the second coil tap 804. This is equivalent to the second coil output port 806 being connected to the reference port 126 of the second stacked coil 106.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An electrostatic protection device for protecting an input port of an electronic circuit, the electrostatic protection device comprising:
a first stacked coil, a second stacked coil, and an input terminal, wherein the second stacked coil is inductively coupled to the first stacked coil;
wherein the first stacked coil comprises a first coil input connected to the input terminal, and a first coil output port connected to a lower frequency ESD protection circuit, and wherein the lower frequency ESD protection circuit comprises a lower frequency output; and
wherein the second stacked coil comprises an output port connected to a higher frequency ESD protection circuit, and wherein the higher frequency ESD protection circuit comprises a higher frequency output.

2. The electrostatic protection device of claim 1, wherein the first stacked coil and the second stacked coil form a crossover network configured to divide a signal input into the input terminal into a higher frequency component and a lower frequency component, wherein the higher frequency component being output by the higher frequency output and the lower frequency component being output by the lower frequency output.

3. The electrostatic protection device of claim 1, wherein the first stacked coil further comprises a first coil termination port connected to a termination load.

4. The electrostatic protection device of claim 1, wherein the first stacked coil is a T-coil with a single coil tap.

5. The electrostatic protection device of claim 4, wherein the single coil tap divides the first stacked coil into a first coil portion and a second coil portion, the single coil tap is the first coil output, the second coil portion being connected between the single coil tap and the coil termination port, and the first coil portion being connected between the single coil tap and the first coil input.

6. The electrostatic protection device of claim 5, wherein an inductive coupling between the first coil portion and the second stacked coil is greater than the inductive coupling between the second coil portion and the second stacked coil.

7. The electrostatic protection device of claim 6, wherein the second stacked coil comprises a reference port connected to a ground plane of the electrostatic protection device.

8. The electrostatic protection device of claim 1, wherein the lower frequency ESD protection circuit comprises a human body model ESD protection circuit.

9. The electrostatic protection device of claim 8, wherein the lower frequency ESD protection comprises an additional charge device model ESD protection circuit.

10. The electrostatic protection device of claim 1, wherein the first stacked coil comprises a first coil tap and a second coil tap, and the lower frequency ESD protection circuit is connected to the first coil tap and the second coil tap.

11. The electrostatic protection device of claim 10, wherein the first stacked coil comprises a first coil portion, an intermediate coil portion, and a second coil portion, wherein the first coil portion is connected between the first coil input and the first coil tap, the intermediate coil portion is connected between the first coil tap and the second coil tap, and the second coil portion is connected between the second coil tap and the first coil termination port.

12. The electrostatic protection device of claim 11, wherein the lower frequency ESD protection circuit comprises a human body model ESD protection circuit, the lower frequency ESD protection comprising an additional charge device model ESD protection circuit, the additional charge device model ESD protection circuit is connected to the first coil tap, and the human body model ESD protection circuit is connected to the second coil tap.

13. The electrostatic protection device of claim 1, wherein the second stacked coil comprises a reference port connected to a ground plane of the electrostatic protection device.

14. The electrostatic protection device of claim 1, wherein the second stacked coil comprising a reference port is connected to the second coil tap.

15. The electrostatic protection device of claim 1, wherein the first stacked coil is at least partially formed from a top two metallization layers of the electrostatic protection device.

16. The electrostatic protection device of claim 1, wherein the higher frequency ESD protection circuit comprises a primary charge device model ESD protection circuit.

17. The electrostatic protection device of claim 16, wherein the primary charge device model ESD protection circuit has a primarily reactive impedance.

18. The electrostatic protection device of claim 1, wherein the summation circuit is a Continuous Time Linear Equalizer circuit.

19. The electrostatic protection device of claim 18, wherein the input port of the electronic circuit is a differential input port, where the differential input port is formed by two electrostatic protection devices connected together via the continuous time linear equalizer circuit.

20. The electrostatic protection device of claim 1, wherein the summation circuit is formed from a summing amplifier.

21. The electrostatic protection device of claim 1, wherein the termination load is resistive.

22. The electrostatic protection device of claim 1, further comprising a summation circuit configured for outputting a summation of the higher frequency output and the lower frequency output to the input port of the electronic circuit.

23. An integrated circuit comprising an electronic circuit, the integrated circuit comprising an electrostatic protection device for protecting an input port of the electronic circuit, the electrostatic protection device comprising:
a first stacked coil, a second stacked coil, and an input terminal, wherein the second stacked coil is inductively coupled to the first stacked coil;
wherein the first stacked coil comprises a first coil input connected to the input terminal, and a first coil output port connected to a lower frequency ESD protection circuit, and wherein the lower frequency ESD protection circuit comprises a lower frequency output; and
wherein the second stacked coil comprises an output port connected to a higher frequency ESD protection circuit, and wherein the higher frequency ESD protection circuit comprises a higher frequency output.

24. The integrated circuit of claim 23, wherein the integrated circuit is selected from a group consisting of: a microprocessor, a microcontroller, a graphical processing unit, a central processing unit, wide band amplifier, analog to digital converter, digital to analog converter, wireline transceiver circuit, and a telecommunications chip.

25. The integrated circuit of claim 23, wherein the integrated circuit comprises a substrate, the electronic circuit being formed on the substrate, the electrostatic protection device being formed on the substrate, and the second stacked coil being formed closer to the substrate than the first stacked coil.

* * * * *